(12) United States Patent
Friedman et al.

(10) Patent No.: US 6,619,903 B2
(45) Date of Patent: Sep. 16, 2003

(54) SYSTEM AND METHOD FOR RETICLE PROTECTION AND TRANSPORT

(76) Inventors: Glenn M. Friedman, 15 Bartram Dr., Redding, CT (US) 06896; Michael DeMarco, 1335 New Seabury La., Victor, NY (US) 14564; Jorge S. Ivaldi, 2060 Huntington Turnpike, Trumbull, CT (US) 06611; James A. McClay, 28 Tilquist Rd., Oxford, CT (US) 06483

( * ) Notice: Subject to any disclaimer, the term of this patent is extended or adjusted under 35 U.S.C. 154(b) by 0 days.

(21) Appl. No.: 09/925,722

(22) Filed: Aug. 10, 2001

(65) Prior Publication Data

US 2003/0031545 A1 Feb. 13, 2003

(Under 37 CFR 1.47)

(51) Int. Cl.$^7$ .......................... B65G 49/07; H01L 21/68
(52) U.S. Cl. ..................... 414/331.14; 414/331.18; 414/416.05; 414/416.11; 414/940; 901/30; 901/40; 901/41
(58) Field of Search ................. 414/331.14, 331.18, 414/416.05, 416.11, 940; 901/30, 40, 41

(56) References Cited

U.S. PATENT DOCUMENTS

| | | | | |
|---|---|---|---|---|
| 5,390,785 A | * | 2/1995 | Garrie et al. | 206/213.1 |
| 5,884,392 A | * | 3/1999 | Laford | 29/722 |
| 6,090,176 A | * | 7/2000 | Yoshitake et al. | 414/220 X |
| 6,239,863 B1 | | 5/2001 | Catey et al. | 355/75 |
| 6,507,390 B1 | | 1/2003 | Ivaldi | 355/75 |

OTHER PUBLICATIONS

Yoshitake, S. et al. "New Mask Blank Handling System for the Advanced Electron Beam Writer," 19$^{th}$ Annual BACUS Symposium on Photomask Technology,, Monterey, California, Sep. 1999., SPIE, vol. 3873, pp. 905–915.

* cited by examiner

Primary Examiner—Steven A. Bratlie
(74) Attorney, Agent, or Firm—Sterne, Kessler, Goldstein & Fox P.L.L.C.

(57) ABSTRACT

A reticle protection and transport system and method for a lithography tool. The system includes an indexer that stores a plurality of reticles and a removable reticle cassette. The removable reticle cassette is comprised of an inner chamber and an outer chamber. The system further includes an end effector coupled to a robotic arm. The end effector engages one of the plurality of reticles to enable the reticle to be positioned within the removable reticle cassette and thereafter transported. The system further includes a seal, coupled to the end effector and the robotic arm. To transport the reticle, the reticle is first loaded onto the end effector. Next, the end effector is used to create an arrangement wherein the reticle is loaded into the removable reticle cassette. Importantly, the reticle and removable reticle cassette do not come into contact with one another. The reticle and removable reticle cassette arrangement is then sealed and transported from the indexer to a mount for performing lithographic exposure. Once lithographic exposure is completed, the arrangement is returned to the indexer and the reticle is withdrawn from the removable reticle cassette.

9 Claims, 5 Drawing Sheets

SYSTEM AND METHOD FOR RETICLE PROTECTION AND TRANSPORT

BACKGROUND OF THE INVENTION

1. Field of the Invention

This invention relates generally to lithography, and more specifically to the protection and transport of lithographic reticles.

2. Related Art

Lithography is a process used to create features on the surface of substrates. Such substrates can include those used in the manufacture of flat panel displays, circuit boards, various integrated circuits, and the like. A semiconductor wafer, for example, can be used as a substrate to fabricate an integrated circuit.

During lithography, a reticle is used to transfer a desired pattern onto a substrate. The reticle is formed of a material transparent to the lithographic wavelength being used. For example, in the case of visible light, the reticle would be formed of glass. The reticle has an image printed on it. The size of the reticle is chosen for the specific system in which it is used. During lithography, a wafer, which is supported by a wafer stage, is exposed to an image projected onto the surface of the wafer corresponding to the image printed on the reticle.

The projected image produces changes in the characteristics of a layer, for example photoresist, deposited on the surface of the wafer. These changes correspond to the features projected onto the wafer during exposure. After exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface of the wafer. As should be clear from the above discussion, the accurate location and size of features produced through lithography is directly related to the precision and accuracy of the image projected onto the wafer.

In addition to the transmissive reticles just described, reflective reticles are also used in the art. For example, reflective reticles are used for short wavelength light that would otherwise be absorbed by a transmissive glass reticle.

In an effort to keep contamination of the reticle surface to a minimum, lithography processing is performed in a "clean room." A clean room is an enclosure having a specified controlled particle concentration. In order to maintain the specified controlled particle concentration, gaseous materials are provided to and removed from the enclosure. A considerable amount of expense is associated with maintaining a clean room. This expense is related, in part, to the size of the clean room and the equipment needed to maintain it. For example, as reticles are transported from one stage in a lithographic process to another, they are susceptible to contamination due to particles found within the processing area. To minimize the potential for contamination, the entire room in which the reticle is transported is usually maintained in a clean state. Thus, there is an incentive to reduce the environment that must be maintained in the clean state. A further incentive for reducing the size of the clean room is safety. In some cases, clean rooms are oxygen deficient and therefore unfit for human occupancy. If the clean room can be isolated to a smaller environment, then the surrounding area can be maintained for safe use and occupancy by humans.

U.S. Pat. No. 6,239,863 issued to Catey et al., May 29, 2001, and commonly assigned to Silicon Valley Group, Inc. (incorporated by reference herein in its entirety) discloses a removable cover for protecting a reticle used in a lithography system. The removable cover includes a frame and a membrane supported by the frame. The removable cover can further include at least one reticle fastener that applies force to the reticle, thereby preventing movement of the removable cover relative to the reticle when the removable cover is in place. The use of the reticle fastener presents an opportunity for contamination from the contact between the reticle and the reticle fastener.

Thus, what is needed is a way of further reducing the potential for reticle contamination during transport. while also reducing the need to maintain cleanliness in a much larger volume within an enclosure or in a large environment.

BRIEF SUMMARY OF THE INVENTION

The present invention provides a reticle protection and transport system and method for a lithography tool. The system includes an indexer that stores a plurality of reticles and a removable reticle cassette. The removable reticle cassette comprises an inner chamber and an outer chamber. The system further includes an end effector coupled to a robotic arm. The end effector engages one of the plurality of reticles to enable the reticle to be positioned within the removable reticle cassette and thereafter transported. To further protect the reticle within the removable reticle cassette, the system further includes a seal coupled to the end effector and the robotic arm.

To transport the reticle, the reticle is first loaded onto the end effector. Next, the end effector is used to create an arrangement wherein the reticle is loaded into the removable reticle cassette. Importantly, the reticle and removable reticle cassette do not come into contact with each other. The arrangement is then sealed and transported from the indexer to the mount for performing lithographic exposure. Once lithographic exposure is completed, the arrangement is returned to the indexer, where the reticle is withdrawn from the removable reticle cassette and stored.

These and other advantages and features will become readily apparent in view of the following detailed description of the invention.

BRIEF DESCRIPTION OF THE DRAWINGS/FIGURES

The present invention is described with reference the accompanying drawings. In the drawings, like reference numbers indicate identical or functionally similar elements. Additionally, the left-most digit of a reference number identifies the drawing in which the reference number first appears.

DETAILED DESCRIPTION OF THE INVENTION

The preferred embodiment of the present invention will now be discussed in detail. While specific features, configurations and arrangements are discussed, it should be understood that this is done for illustration purposes only. A person skilled in the relevant art will recognize that other steps, configurations and arrangements or devices may be used to achieve the features of the invention without departing from the spirit and scope thereof. Indeed, for the sake of brevity, conventional electronics, manufacturing of semiconductor devices, and other functional aspects of the method/apparatus (and components of the individual operating components of the apparatus) may not be described in detail herein.

Figure 1:
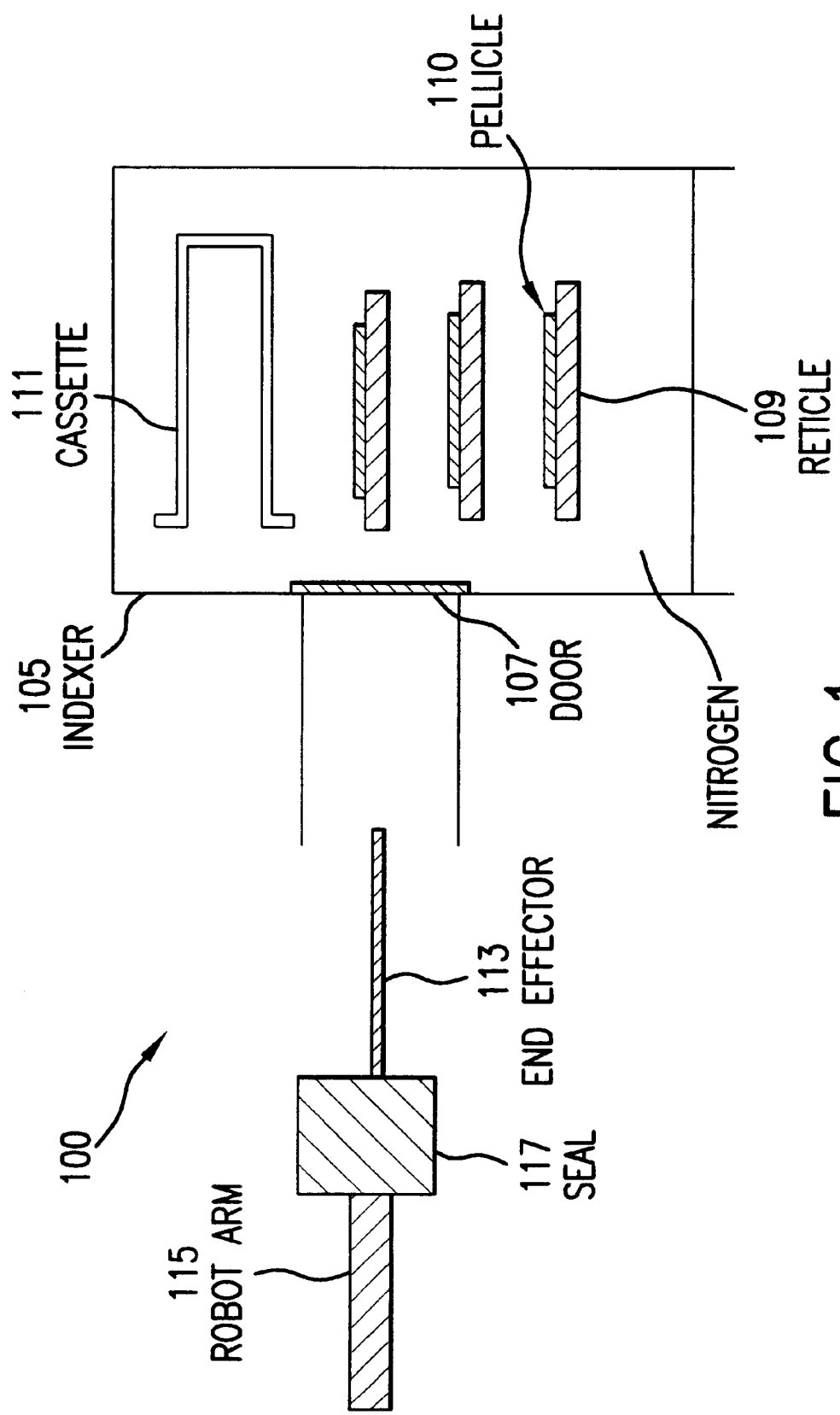
FIG. 1 is an illustration of a reticle transport system in accordance with an embodiment of the present invention.

FIG. 1 illustrates a reticle transport system 100 for a lithography tool. The reticle transport system 100 includes an indexer 105. In accordance with an embodiment of the present invention, the indexer 105 further comprises a library of shelves (not shown) within the lithography tool. An inert gas atmosphere is maintained within the indexer 105. According to an embodiment, for example, the indexer 105 is filled with Nitrogen gas and other gaseous materials necessary to meet the clean room requirements.

A plurality of reticles 109 are stored on shelves (not shown) within the indexer 105. Reticles are used to transfer a particular pattern onto a substrate such as a semiconductor wafer, a panel display, a circuit board, and the like. The reticle can be of the reflective or transmissive type, as would be apparent to a person skilled in the lithography art. To protect the reticle 109 from contamination, a pellicle 110 may be fixed over the reticle 109. An example of a pellicle that can be used in connection with the present invention is described in commonly owned. co-pending U.S. non-provisional patent application no. 09/501,180, filed Feb. 10, 2000, titled "Method and Apparatus for a Reticle with Purged Pellicle-to-Reticle Gap," which is incorporated herein by reference.

Although the reticles in FIG. 1 are positioned vertically to each other, this presentation is for example only and not limitation. In alternative embodiments, the reticles could also be stored horizontally to one another. Likewise, in another embodiment, the reticles could be stored on a carousel and the reticles rotated to a particular position within the indexer. In a preferred embodiment, the reticle 109 and Pellicle 110 are stored upside down. In this way, any contaminants falling on the reticle will be on the backside. If the reticle 109 and pellicle 110 are stored upright (as depicted in FIG. 1) then the end effector 113 could be made to rotate the reticle and pellicle upside down. After reading this disclosure, a person skilled in the relevant art(s) will recognize other arrangements for storing reticles 109 and pellicle 110 within the indexer 105, without departing from the scope of the present invention.

A removable reticle cassette 111 is also stored within the indexer 105. The removable reticle cassette 111 is used to house the reticle 109 during transport. The environment of the removable retice cassette 111 is also maintained in a "clean" state. In this way, the clean room state is maintained in a much smaller volume of space. Although the indexer 105 is shown containing only one removable reticle cassette 111, this is for example only, and is not intended to limit the present invention. The number of removable reticle cassettes 111 and likewise, the number of stored reticles 109 are determined by the space constraints of the indexer 105. The present invention is described with reference to a reticle, having a pellicle attached thereto. However, this is for example only, and not limitation. Reticles, without a pellicle, can be used without departing from the scope and spirit of the present invention. Further details of the removable reticle cassette 111 will be provided below with respect to FIG. 2.

The reticle transport system 100 further comprises an end effector 113, coupled to a robotic arm 115. The end effector 113 engages one of the plurality of reticles 109 and pellicle 110 in order to position the reticle 109 and pellicle 110 within the removable reticle cassette 111. In alternative embodiments, a wand or other manual or robotic device capable of engaging the reticle or pellicle (if present) may also be used. In a preferred embodiment, the end effector 113 engages the reticle 109 and pellicle 110 through electrostatic attraction. In alternative embodiments, the end effector 113 could engage the reticle 109 and pellicle 110 through vacuum attraction.

A seal 117 is also used in the reticle transport system 100. The seal 117 is used to secure the reticle within the removable a reticle cassette 111. The seal 117 can be any device capable of securing the reticle 109 within the removable reticle cassette 111 while at the same time, preventing contaminants from entering into the removable reticle cassette and nitrogen from escaping the removable reticle cassette 111. For example, the seal 117 could be a vacuum seal or a magnetic seal. Accordingly, a vacuum system, a magnetic system, or the like, can also be used in connection with the present invention to facilitate the sealing function.

The reticle transport system 100 further comprises a door 107. The door 107 is used to keep the contaminants from coming into the indexer 105 and the nitrogen gas from seeping out. In alternative embodiments, indexer 105 may be provided with more than one door 107. For example, additional doors may be used to provide access to the indexer 105 for manual or automatic loading of the plurality of reticles 109 and the removable reticle cassette 111. Foreseeable reasons for accessing the indexer 105 might also include repair of the indexer 105, replacement of the reticles 109, or the like. Still further, the end effector 113 could be made to pass through one or more doors 107 before engaging the reticle 109.

Figure 2:
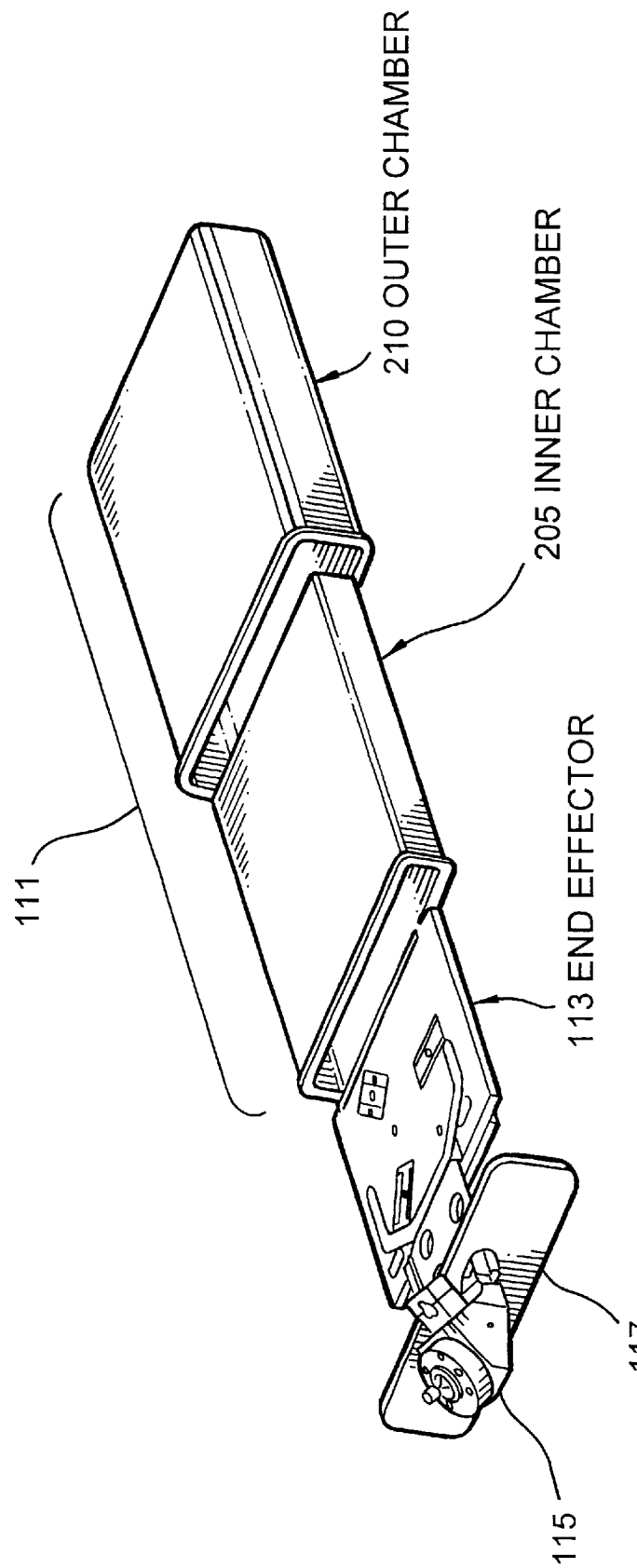
FIG. 2 is an illustration of a removable reticle cassette according to an embodiment of the present invention.

FIG. 2 provides a perspective view of an exemplary removable reticle cassette 111 in accordance with an embodiment of the present invention. In this embodiment, the removable reticle cassette 111 comprises an inner chamber 205 and an outer chamber 210. The inner chamber 205 carries the reticle 109 and the pellicle 110. The inner chamber 205 is sealed within the outer chamber 210 by the seal 117 during reticle exchanges. The outer chamber 210 is used to contain the nitrogen gas and other gaseous materials necessary to provide the clean state environment.

The material used for the removable reticle cassette 111 should be compatible with standard cleaning agents used with lithography systems. The materials should not result in the production of outgassing of amines, or other undesirable substances harmful to the lithographic process. Still further, the material should be resistant to mechanical degradation. Examples of possible materials that could be used include fiber reinforced molded polymers, Derlin (trademark) or PTFE (Teflon (trademark)) coated metals such as aluminum or titanium. Other materials may be used without departing from the scope of the present invention.

In accordance with embodiments of the present invention, the removable reticle cassette 111 accommodates reticles with any type of pellicle and reticles without a pellicle. Furthermore, the removable reticle cassette 111 also accommodates solid or breathable pellicle frames.

Figure 3:
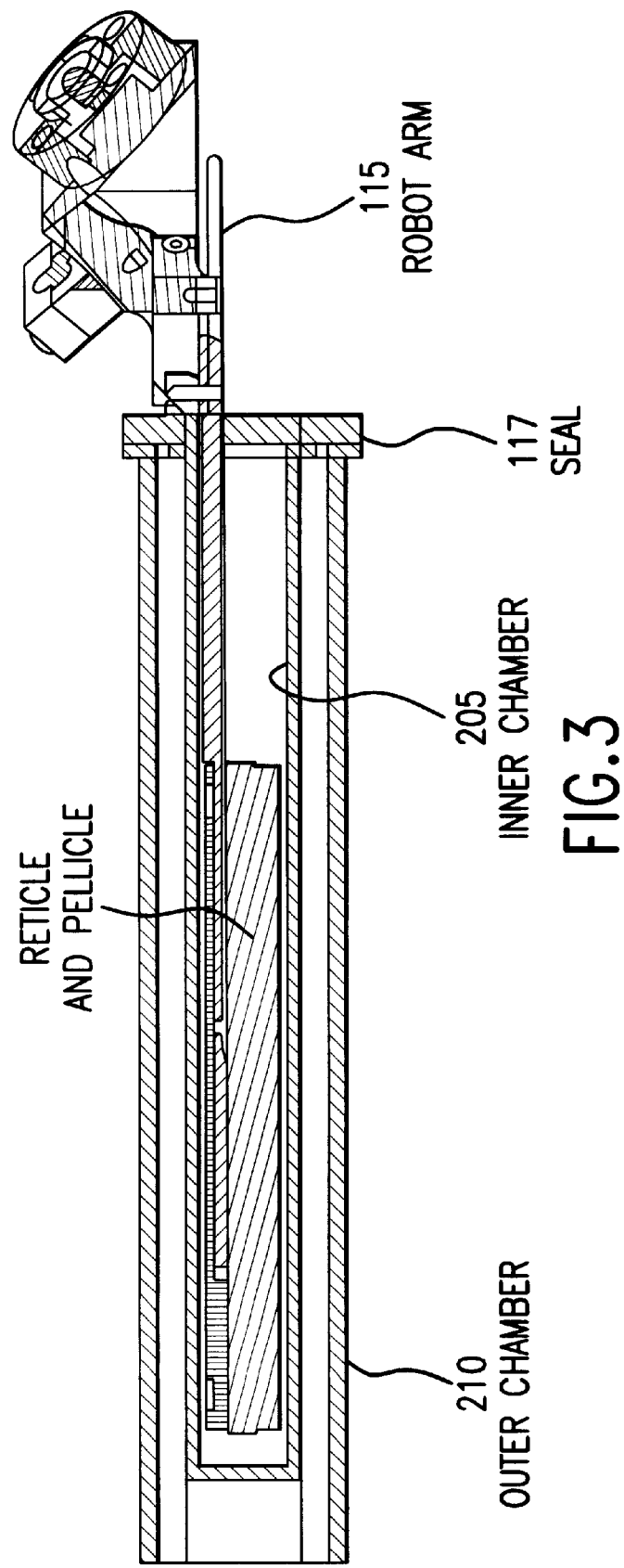
FIG. 3 is an illustration of an arrangement of a reticle and pellicle within a removable reticle cassette according to an embodiment of the present invention.

FIG. 3 provides an illustration of the arrangement of a reticle 109 and pellicle 110 sealed within the removable reticle cassette 111, which is ready for transport by the robot arm 115, in accordance with an embodiment of the present invention. The end effector 111 is shown engaging a reticle and pellicle. In alternative embodiments, a wand or other mechanical, electromechanical, or robotic device capable of engaging the reticle or pellicle may also be used. After reading this disclosure, additional engaging means will be apparent to a person skilled in the relevant art(s). A method for transporting a reticle 109 from the indexer 105 will now be described with respect to FIGS. 4 and 5.

Figure 4:
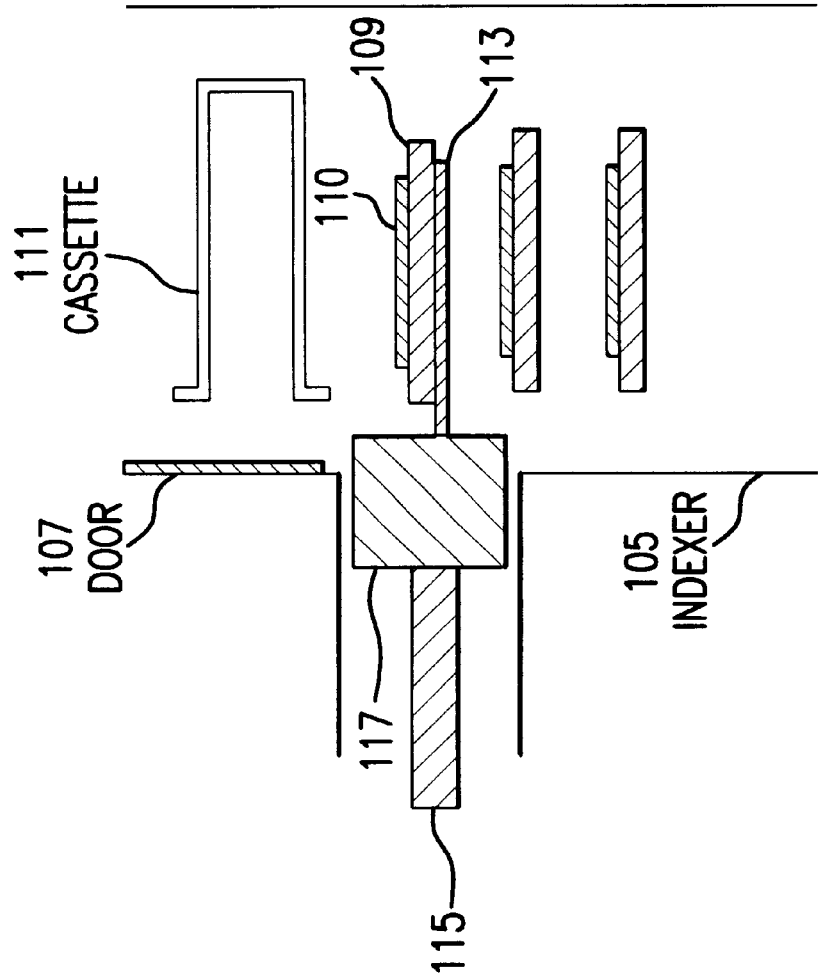
FIGS. 4 and 5 are illustrations of a method of loading a reticle into a removable reticle cassette according to an embodiment of the present invention.

Referring to FIG. 4, a method of transporting a reticle 109 from the indexer 105 in a lithography system begins with the opening of the door 107 to allow the end effector 113 to gain access to the content of the indexer 105.

Next, the reticle 109 and pellicle 110 are engaged by the end effector 113. In accordance with embodiments of the present invention, the end effector 113 can engage the reticle 109 and pellicle 110 by means of a vacuum, electrostatic charge, magnet, wand, or other lifting devices. Once the reticle 109 and pellicle 110 are fixed to the end effector 113, the robot arm 115 is used to maneuver the end effector 113 toward the removable reticle cassette 111. In a preferred embodiment, the reticle 109 and pellicle 110 would be oriented so that they are upside down. In this way, any potential contamination would be on the backside of the reticle.

Figure 5:
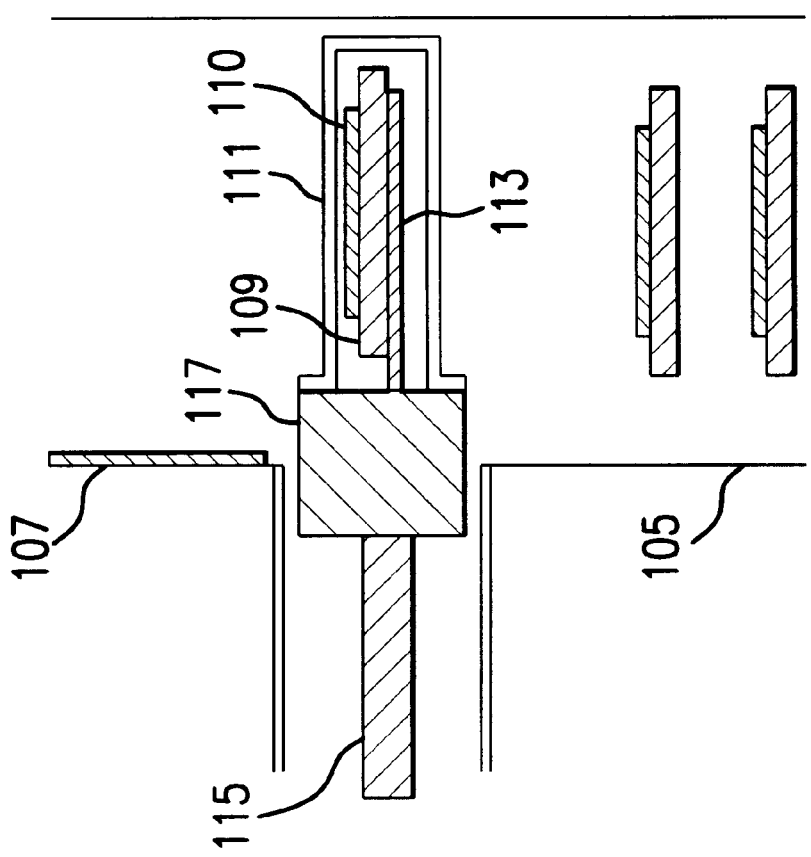

FIG. 5 depicts the reticle 109 and pellicle 110 being loaded into the removable reticle cassette 111, such that the removable reticle cassette 111 does not come into contact with the reticle 109 and pellicle 110. Once the reticle 109 and pellicle 110 are placed within the removable reticle cassette 111, the seal 117 is used to secure the clean environment, thereby producing a sealed arrangement.

Finally, the robot arm 115 is used to transport the sealed arrangement from the indexer 105 to a mount for performing lithographic exposure. Once the lithographic exposure process is completed, in accordance with embodiments of the present invention, the sealed arrangement is returned to the indexer 105. The reticle 109 and pellicle 110 are then removed from the removable reticle cassette 111 through reversal of the process described in FIGS. 4 and 5.

Conclusion

While various embodiments of the present invention have been described above, it should be understood that they have been presetted by way of example only, and not limitation. It will be understood by those skilled in the art that various changes in form and details can be made herein without departing from the spirit and scope of the invention, as defined in the appended claims. Thus, the breadth and scope of the present invention should not be limited by any of the above-describe exemplary embodiments, but should be defined only in accordance with the following claims and their equivalents.

What is claimed is:

1. A reticle transport system for a lithography tool having a robotic arm, comprising:
    (a) an indexer that stores a plurality of reticles and a removable reticle cassette;
    (b) an end effector, coupled to the robotic arm, that engages one of said plurality of reticles to enable said one of said plurality of reticles to be positioned within said removable reticle cassette and thereafter transported; and
    (c) a seal that seals said one of said plurality of reticles inside said removable reticle cassette.

2. The reticle transport system of claim 1, wherein said removable reticle cassette comprises an inner chamber and an outer chamber.

3. The reticle transport system of claim 1 wherein said seal is coupled to said end effector.

4. The reticle transport system of claim 1, wherein said seal is coupled to said robotic arm.

5. The reticle transport system of claim 1, wherein said seal includes a vacuum system to attach said removable reticle cassette to the robotic arm.

6. The reticle transport system of claim 1, wherein said seal includes a magnet system to attach said removable reticle cassette to the robotic arm.

7. A method of transporting a reticle from a indexer to a mount in a lithography tool, comprising the steps of:
    (a) loading the reticle, stored in the indexer, onto an end effector;
    (b) loading the reticle into a removable reticle cassette, stored in the indexer, to create an arrangement wherein said removable reticle cassette does not come into contact with said reticle; and
    (c) transporting said arrangement from the indexer to the mount for performing lithographic exposure.

8. The method of claim 7, further comprising a step of returning said arrangement to the indexer after performing lithographic exposure.

9. A method of transporting a reticle in a lithography tool, comprising the steps of:
    (a) storing a plurality of reticles and a removable reticle cassette in an indexer;
    (b) coupling an end effector to a robotic arm that engages one of the plurality of reticles, to enable the one of said plurality of reticles to be positioned within the removable reticle cassette;
    (c) sealing said one of the plurality of reticles inside the removable reticle cassette with a seal that is coupled to the end effector to produce a sealed arrangement; and
    (d) transporting the sealed arrangement.

* * * * *